(12) United States Patent
Monro

(10) Patent No.: US 7,602,316 B2
(45) Date of Patent: Oct. 13, 2009

(54) DATA CODING/DECODING FOR ELECTRICAL COMPUTERS AND DIGITAL DATA PROCESSING SYSTEMS

(76) Inventor: Donald M. Monro, 6, The Lays, Goose Street, Beckington, Somerset (GB) BA11 6RS ( * ) Notice: Subject to any disclaimer, the term of this patent is extended or adjusted under 35 U.S.C. 154(b) by 0 days.

(21) Appl. No.: 11/776,786

(22) Filed: Jul. 12, 2007

(65) Prior Publication Data

US 2009/0019069 A1 Jan. 15, 2009

(51) Int. Cl.
*H03M 7/00* (2006.01)
(52) U.S. Cl. .......................... 341/50; 710/74
(58) Field of Classification Search ............ 341/50, 341/51, 83; 710/62, 74
See application file for complete search history.

(56) References Cited

U.S. PATENT DOCUMENTS

| | | | |
|---|---|---|---|
| 4,168,513 A | 9/1979 | Hains et al. | |
| 4,509,038 A | 4/1985 | Hirano | |
| 5,748,786 A | 5/1998 | Zandi et al. | |
| 5,754,704 A | 5/1998 | Barnsley et al. | |
| 5,768,437 A | 6/1998 | Monro et al. | |
| 6,078,619 A | 6/2000 | Monro et al. | |
| 6,272,241 B1 * | 8/2001 | Tattersall | 382/181 |
| 6,373,411 B1 | 4/2002 | Shoham | |
| 6,556,719 B1 | 4/2003 | Monro | |
| 6,990,145 B2 | 1/2006 | Monro et al. | |
| 7,015,837 B1 | 3/2006 | Malvar | |
| 7,030,789 B1 | 4/2006 | Cideciyan et al. | |
| 7,082,483 B2 * | 7/2006 | Poo | 710/68 |
| 7,155,445 B1 * | 12/2006 | Kling et al. | 707/101 |
| 7,265,691 B2 | 9/2007 | Tomic | |
| 7,340,013 B2 | 3/2008 | Ammer et al. | |
| 2004/0126018 A1 | 7/2004 | Monro | |
| 2004/0165737 A1 | 8/2004 | Monro | |

FOREIGN PATENT DOCUMENTS

| | | |
|---|---|---|
| EP | 0595599 A2 | 5/1994 |
| EP | 0836325 | 4/1998 |
| EP | 0 939 554 A2 | 9/1999 |
| GB | 2293733 A | 4/1996 |
| WO | WO97/16029 | 5/1997 |
| WO | WO 99/08449 | 2/1999 |
| WO | WO 01/63935 | 8/2001 |

OTHER PUBLICATIONS

U.S. Appl. No. 11/777,256, filed Jul. 12, 2007, Monro.
U.S. Appl. No. 11/777,239, filed Jul. 12, 2007, Monro.
U.S. Appl. No. 11/777,230, filed Jul. 12, 2007, Monro.
U.S. Appl. No. 11/777,144, filed Jul. 12, 2007, Monro.
U.S. Appl. No. 11/777,130, filed Jul. 12, 2007, Monro.
U.S. Appl. No. 11/777,122, filed Jul. 12, 2007, Monro.
U.S. Appl. No. 11/777,100, filed Jul. 12, 2007, Monro.
U.S. Appl. No. 11/777,022, filed Jul. 12, 2007, Monro.

(Continued)

*Primary Examiner*—Peguy JeanPierre

(57) ABSTRACT

Embodiments of methods, systems and/or devices for data coding are disclosed. Briefly, in accordance with one embodiment, data is coded and transmitted via an input/output portion of a computing platform to one or more other portions of the computing platform. An interconnect is employed to facilitate transmitting the coded data.

28 Claims, 6 Drawing Sheets

OTHER PUBLICATIONS

U.S. Appl. No. 11/776,786, filed Jul. 12, 2007, Monro.

U.S. Appl. No. 11/422,316, filed Jun. 5, 2006, Monro.

De Natale, et al., "A Mesh-Interpolation Scheme for Very-Low Bitrate Coding of Video Sequences" European Transactions on Telecommunications, vol. 9, No. 1, pp. 47-55, 1998.

Tian et al., "Image Data Processing in the Compressed Wavelet Domain" Proceedings of ICSP'96, pp. 978-981, 1996.

Said et al., "A New, Fast, and Efficient Image Codec Based on Set Partitioning in Hierarchical Trees" IEEE Transactions on Circuits and Systems for Video Technology, vol. 6, No. 3, pp. 243-250, Jun. 1996.

Shapiro, "Embedded Image Coding Using Zerotrees of Wavelet Coefficients" IEEE Transactions on Signal Processing, vol. 41, No. 12, pp. 3445-3462, Dec. 1993.

Horst et al., "Mupcos: A multi-purpose coding scheme" Signal Processing: Image Communication 5, pp. 75-89, 1993.

International Search Report and Written Opinion for PCT/US2008/069539 completed Sep. 5, 2008.

International Search Report and Written Opinion for PCT/US2008/069543 completed Sep. 5, 2008.

Communication and Written Opinion for PCT/US2008/069497 mailed Oct. 9, 2008.

Communication and Written Opinion for PCT/US2008/069317 mailed Oct. 9, 2008.

International Search Report and Written Opinion for PCT/US2008/069502 mailed Nov. 3, 2008.

Anonymous: "Conversion Between Different Number Systems," Internet Article, (Online) Nov. 11, 2002, XP002494744 Retrieved from the Internet: URL:http://www.cstc.org/data/resources/60/convexp.html> (retrieved on Sep. 5, 2008) the whole document.

Bose et al., "Lee Distance Gray Codes," Information Theory, 1995. Proceedings., 1995 IEEE International Symposium on Whistler, BC, Canada Sep. 17-22, 1995, New York, NY, USA, IEEE, US, Sep. 17, 1995.

R.F. Rice, "Some Practical Universal Noiseless Coding Techniques," Jet Propulsion Laboratory, Pasadena, California, JPL Publication 79-22, Mar. 1979.

\* cited by examiner

DATA CODING/DECODING FOR ELECTRICAL COMPUTERS AND DIGITAL DATA PROCESSING SYSTEMS

FIELD

This disclosure is related to data coding, such as, for example, data compression within electrical computers and digital data processing systems. Subject matter disclosed herein may relate to processes or apparatus for transferring data from one or more peripherals to one or more computers or digital data processing systems for the latter to process, store, and/or further transfer and/or for transferring data from the computers or digital data processing systems to the peripherals. Subject matter disclosed herein may relate to processes or apparatus for interconnecting or communicating between two or more components connected to an interconnection medium a within a single computer or digital data processing system. Subject matter disclosed herein may relate to processes or apparatus for transferring data from one computer or digital processing system to another computer or digital processing system via a network or other interconnection medium.

BACKGROUND

Data sharing between portions of a computing platform and/or over networks has become more and more common in recent years. However, bandwidth is typically a limiting factor when sharing data between portions of a computing platform and/or over networks. It may be desirable to code data, such as by data compression prior to transmitting the data between portions of a computing platform and/or over networks. Additionally, for similar reasons it may be desirable to code and/or compress data before storing data on a storage medium.

BRIEF DESCRIPTION OF THE DRAWINGS

Subject matter is particularly pointed out and distinctly claimed. Claimed subject matter, however, both as to organization and method of operation, together with objects, features, and advantages thereof, may best be understood by reference of the following detailed description when read with the accompanying drawings in which:

Figure 1:
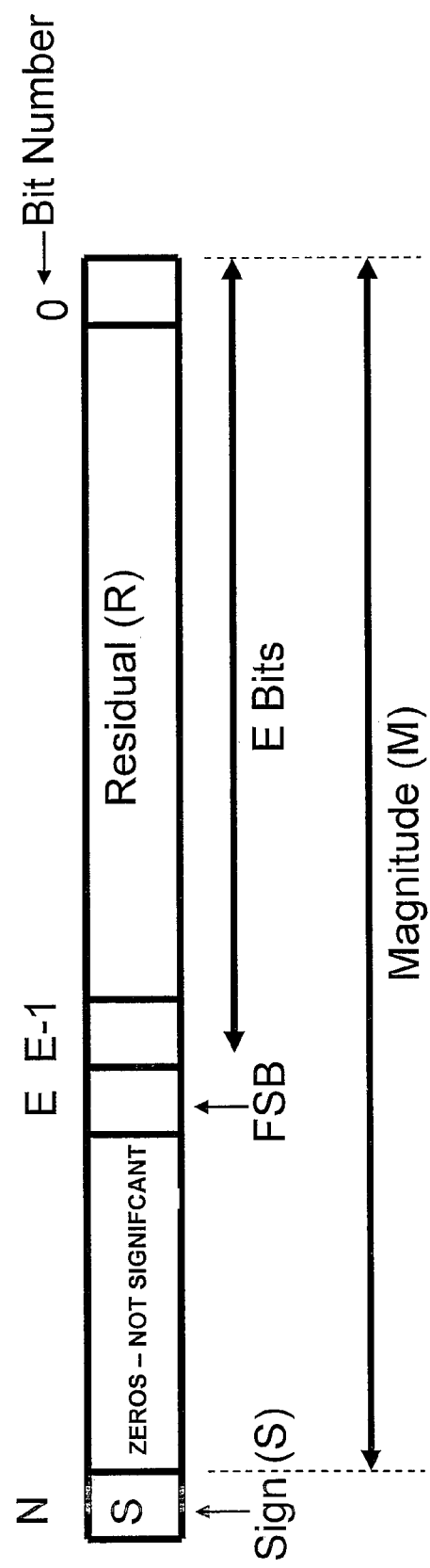
FIG. 1 is a schematic diagram illustrating an encoded integer in accordance with an embodiment.

It will be appreciated that for simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding or analogous elements.

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, well-known methods, procedures and/or components have not been described in detail so as not to obscure claimed subject matter.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" and/or "an embodiment" in various places throughout this specification are not necessarily all referring to the same embodiment. Furthermore, the particular features, structures, and/or characteristics may be combined in one or more embodiments.

Some portions of the detailed description which follow are presented in terms of algorithms and/or symbolic representations of operations on data bits and/or binary digital signals stored within a computing platform, such as within a computer and/or computing platform memory. These algorithmic descriptions and/or representations are the techniques used by those of ordinary skill in the data processing arts to convey the substance of their work to others skilled in the art. An algorithm is here, and generally, considered to be a self-consistent sequence of operations and/or similar processing leading to a desired result. The operations and/or processing may involve physical manipulations of physical quantities. Typically, although not necessarily, these quantities may take the form of electrical and/or magnetic signals capable of being stored, transferred, combined, compared and/or otherwise manipulated. It has proven convenient, at times, principally for reasons of common usage, to refer to these signals as bits, data, values, elements, symbols, characters, terms, numbers, numerals, integers and/or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing", "computing", "calculating", "determining" and/or the like refer to the actions and/or processes that may be performed via a computing device, which manipulates and/or transforms data represented as physical, electronic and/or magnetic quantities and/or other physical quantities within the computing device's processors, memories, registers, and/or other information storage, transmission, reception and/or display devices. Accordingly, a computing device refers to a system or a device that includes the ability to process and/or store data in the form of signals. Thus, embodiments of a computing device may comprise hardware, software, firmware and/or any combination thereof. Further, unless specifically stated otherwise, a process as described herein, with reference to flow diagrams or otherwise, may also be executed and/or controlled, in whole or in part, by a computing device.

Although claimed subject matter is not so limited, one potential, although not exclusive, application of an embodiment may be in the field of transmitting data to and/or from input/output portions of a computing platform. Data may be transmitted to other portions of a computing platform and/or from a computing platform to another entity, such as a network or additional computing platform. It may be desirable in this particular field, for example, to compress data relatively efficiently prior to transmitting. In this and analogous fields, it may also be desirable to transmit information across an interconnect, such as an interconnect that may be subject to restrictions on the number of bits that may be transmitted, or on the bit transmission rate. Therefore, relatively efficient coding may result in more information being transmitted per unit time, for example. Another application, also previously suggested, may be in the compression of data on an electronic device, such as for storage in files, for example. This may, for example, reduce the amount of memory for storage of the particular data, for example, or, as another example, facilitate transmission of the data by reducing the size of an attachment to an email. Of course, claimed subject matter is not limited to these simple examples. These are provided simply for purposes of illustration.

Likewise, embodiments covered by claimed subject matter include, for example, a computer program capable of implementing any such method, and/or a computing device capable of implementing such a method. Embodiments also include a hardware and/or software based coder capable of carrying out a method as described below in combination with a hardware and/or software decoder capable of reconstructing an original set or grouping of data from a data code representing a compression of such data. These as well as many other embodiments are intended to be within the scope of claimed subject matter.

In at least some embodiments described, data compression may be lossless, although claimed subject matter is not limited in scope in this respect. Furthermore, in this particular context, any grouping, set, block or portion of associated data to be compressed may be treated as an ordered sequence of characters or other symbols. If such data is representative of text, for example, individual symbols may comprise one or more text characters, but that is, of course, not essential. Many other symbols may also be represented. More generally, symbols may be presented by bytes or other sized groupings of data. It is also possible that longer or short portions of data could be used, which may or may not fit within a byte or digital word length, for example. If data is represented in binary form, a symbol could be represented, depending on the particular embodiment, as a single bit or multiple bits of fixed or variable length.

Data, such as stored as a file, a record or other unitary association of data, as one example, might be treated as a whole, or instead partitioned or divided into convenient lengths, long enough for symbol groupings, referred to here as binary symbols, to be coded with some amount of compression efficiency and/or short enough to be processed conveniently. Various approaches are described in more detail below. Data comprising binary symbols may be processed in any order, although sequentially from beginning to end of the set or grouping of data may be one convenient approach. Coding may be carried out by a hardware or software coder. In one possible embodiment, a coder may be arranged to transmit data, after being coded, across a communications channel to a decoder which may be arranged, in real time or otherwise, to use received coded data to reconstruct the set of data. Again, claimed subject matter is not limited in scope to a particular embodiment. Therefore, the embodiments described hereinafter are intended simply as examples for purposes of illustration. Many other approaches and/or embodiments are intended to be included within the scope of claimed subject matter other than these specific examples.

Forming an efficient compressed binary code with data from a range of g symbols which have the same probability has not been a straightforward task when g is not a power of 2. Such data might arise in tossing a die of g sides, for example, or in coding a sequence of equally probable combinations such as might arise in a Combinatorial Coder, as described in co-pending U.S. patent application Ser. No. 11/777,256, by Donald M. Monro, filed Jul. 12, 2007, titled, "Combinatorial Coding/Decoding for Electrical Computers and Digital Data Processing Systems", co-pending U.S. patent application Ser. No. 11/777,239, by Donald M. Monro, filed Jul. 12, 2007, titled, "Blocking for Combinatorial Coding/Decoding for Electrical Computers and Digital Data Processing Systems", and/or co-pending U.S. patent application Ser. No. 11/777,230, by Donald M. Monro, filed Jul. 12, 2007, titled, "Blocking for Combinatorial Coding/Decoding for Electrical Computers and Digital Data Processing Systems". However, it is worthwhile to note that the above-referenced co-pending U.S. Applications describe one or more example embodiments, and the claimed subject matter is not so limited. Furthermore, such data might arise in n coding a sequence of equally or nearly equally probable combinations such as might arise in Golomb Coding, or other applications that are not described in detail herein.

Furthermore, as described in co-pending U.S. Patent Application Ser. No. 11/777,081, by Donald M. Monro, filed Jul. 12, 2007, tiled, "LIFO Radix Coder for Electrical Computers and Digital Data Processing Systems", and/or Ser. No. 11/777,122, by Donald M. Monro, filed Jul. 12, 2007, titled, "FIFO Radix Coder for Electrical Computers and Digital Data Processing Systems", a second codeword s of a combinatorial coder may be coded by employing a Last In First Out (LIFO) method and/or a First In First Out (FIFO) method, as just a few examples. These methods may employ a single or mixed radix, or base, and may additionally interleave data from time to time with bits of binary data. However, it is worthwhile to note that the above-referenced co-pending U.S. Patent Applications describe one or more example embodiments, and embodiments of the claimed subject matter are not limited to implementations including a combinatorial coder, and may employ Golomb coding, for example.

In one embodiment of the claimed subject matter, a buffer, such as a fixed length buffer may be employed as part of a FIFO method of coding data. For example, a buffer may be employed as part of an encoding process as performed for a second codeword s of a combinatorial coder. In one embodiment, the length of the buffer may be known to the coder and/or known to the decoder, although this is not a requirement. Additionally, in one embodiment, a dialogue may take place to inform the decoder of the buffer length, either initially or as coding progresses. Efficiency of the buffer can be calculated, and this information may be employed by a coder to establish an initial buffer length, for example. Furthermore, efficiency may be used to determine a new buffer length as coding progresses based on statistics of the data being coded. The statistics of the data may change as coding progresses, and as the statistics change a new buffer length may become optimal or nearly optimal or merely preferred to the length previously used. The coder may instruct the decoder to change the buffer length in some manner, or the buffer length may be changed adaptively by the coder and decoder following identical rules for determining the buffer length based on previously transmitted data. However, these are merely examples, and the claimed subject matter is not so limited. Furthermore, in this context, the term "buffer" may refer generally to a physical and/or logical portion of a memory device that may be utilized to store data. Data stored in a buffer may additionally be referred to as a "message", and/or a "buffer message", and these terms may be used interchangeably. Accordingly, the term "buffering" as referred to herein may refer generally to storing data and/or a message within a physical and/or logical portion of a memory device, and the term "buffer capacity" as referred to herein may refer generally to the storage space available for storing data and/or a message within a physical and/or logical portion of a memory device, although it is worthwhile to note that the scope of claimed subject matter is not limited in this respect. Additionally, the term "message" as referred to herein may refer generally to the contents of a given physical and/or logical area of memory used for storing messages and/or may refer generally to a communication containing some information sent by from one area and/or location to another area and/or location, and the term "updated message" as referred to herein may refer generally to the process of replacing or extending an established message, although, again, it is worthwhile to note that the scope of claimed subject matter is not limited in this respect In a radix coder, a symbol s may be selected that occurs within a set or grouping of data to be coded. In the application to be considered the symbol s can take g different values, which we may take as 0 to g−1 or equivalently 1 to g, since a simple mapping of the actual values of the symbols may be made into either the range 0 to g−1 or 1 to g, or into any other range of g successive values. Where there are g different values, g will be called the range or 'radix' of the values even though a mapping may be necessary to carry them into the range 0 to g−1 or any other suitable range. In the application to be considered all of the g different values of s may be equally likely to occur, or approximately equally likely, or acceptably equally likely. However the radix coder is not limited to equally likely symbols s. It is well known to experts in the field that if g is a power of 2, then a straightforward way of coding such symbols is by $\log_2(g)$ binary bits, and if they are equally likely the code uses the minimum possible number of bits. For example if g is 16, the numbers 0 to 15 can be coded by 4 bits and if all the numbers are equally likely as would be the case in tossing an unbiased 16 sided die, or spinning a wheel of fortune with 16 equally likely outcomes, coding the outcomes by 4 bits achieves exactly the most efficient code, i.e. the shortest binary code, for a sequence of such symbols.

However, those skilled in the art may be aware that a difficulty arises when g is not a power of 2. For example when g is 11, the theoretical minimum number of bits required to code a sequence of 11 equally probable symbols is $\log_2(11)$ =3.46 bits per symbol, rounded to two decimal places. However, in binary digital communications, storage, or processing, it is not possible to use 3.46 bits to represent an individual symbol. However, situations often arise in which a sequence of such numbers should be stored or communicated efficiently. One such example might be in storing the outcomes of unbiased die tosses, coin tosses, lottery drawings or wheel of fortune spins or similar random events where the number of possible outcomes is not a power of 2. An application in accordance with one or more embodiments as related to run length coding will be explained below.

Golomb coding is well-known and described in Golomb, SW: 'Run-length encodings', *IEEE Trans. Inf. Theory*, 1966, 7, (12), pp. 399-401. Golomb Codes are simply one example of data coding. Therefore, while many of the examples described herein are presented in terms of Golomb coding, it should be clear that it is intended that claimed subject matter not be limited in scope simply to Golomb codes (GCs). Other approaches to coding data may be employed and provide satisfactory results. Nonetheless, continuing with Golomb coding as one example, GCs are often used for run length coding, but, in principle, they are general purpose codes that may be used to encode any symbol, or sequence of symbols, as an integer numeral or a sequence of integer numerals. In one possible embodiment, a unique integer numeral may be assigned to a symbol and the symbol may then be coded by Golomb coding the corresponding numeral, for example. GCs have an advantage that the range of numerals need not be known or constrained in advance.

In one particular example, a Golomb Code of a numeral I, module K (where K is the 'base' in this example) may be defined by (S, E, R) as follows:

S=the Sign of the numeral I, if appropriate (may be omitted if the numerals are either all positive or all negative).

M=the Magnitude of I

E=the exponent $\text{fix}(\log_K(M))$, where fix( ) denotes here a truncation operation, that is, rounding to the next lowest integer numeral.

$R=M-K^E$, is referred to here as a "residual."

The Magnitude of I, therefore, may be obtained by $M=K^E+R$.

It is noted however, that $\log_K(0)$ may provide a mathematical quirk in that K raised to any power should not provide zero. One approach that may be employed to address this includes adding 1 to all non-negative integer numerals so that $\log_K(0)$ should not occur, although, of course, claimed subject matter is not limited in scope in this respect.

At times, out of convenience, for example, K=2, so that a Golomb Code, for example, may provide a form of binary floating point representation of variable length, with exponent E and residual R of variable length E bits. This case which may be known as Rice-Golomb coding, see for example R. F. Rice, "Some Practical Universal Noiseless Coding Techniques," Jet Propulsion Laboratory, Pasadena, Calif., JPL Publication 79-22, March 1979, is illustrated in FIG. 1, for example, although claimed subject matter is not limited in scope in this respect, of course.

In co-pending U.S. patent application Ser. No. 11/422,316, by Donald M. Monro, filed Jun. 5, 2006, there is described how a Variable Length Coder (VLC), such as, for example, a Huffman Coder, may encode the exponent of a code, such as a Golomb Code, for example, for efficiently coding and compressing a stream of symbols. However, the VLC may be adaptive or static, depending, for example, on the particular embodiment.

Furthermore, it is worthwhile to note that in addition to an embodiment of a method of coding of data, embodiments may include a computer program incorporating such a method and/or a coder, such as one implemented in hardware, firmware, software, or combinations therefore. Embodiments may also include video and/or audio codecs embodying such a method, video and/or audio compression systems wherein data may be encoded according to such a method, and in which such data may then be transmitted across an interconnect for reconstruction by a decoder at the far end. Alternatively, the coded data may be stored rather than transmitted. These and many other embodiments are included within the scope of claimed subject matter.

Referring now to FIG. 1, there is illustrated an embodiment of a Golomb-coded N bit fixed point binary integer, using sign and magnitude representation. The leading bit S indicates the sign. This is followed by a number of non-significant leading zeros. The first significant bit (FSB) occurs at location E, with the location of the FSB thereby indicating the value of the exponent. The remaining bits are represented by the subsequent E bits, this being known as the "residual" R in this context. The magnitude M of the integer, in this representation, is simply the value of the binary integer represented by the N bits labeled 0 to N−1.

Here, sign=1 or 0

Likewise, Magnitude=M=$\Sigma 2^n b_n$ where $b_n$ is the value of bit n, 0 or 1, and the summation runs from n=0 to N.

E=Position of FSB=fix($\log_2 M$) for M>=1

R=Residual=M−$2^E$ which has E bits for E>=1 and M>=2.

Given the representation of FIG. 1, to transmit data across a communications channel, in this embodiment, values of S (if appropriate) may be provided along with a positional value E and a value of a residual R. In one embodiment, the residual value is not encoded, and the bits are simply sent one by one, but the claimed subject matter is not so limited. However, in this embodiment, an assumption may be made that all possible values of R are equally likely, or sufficiently equally likely. However, if the base K is not 2 or a power of 2, the coding of R into a binary representation is not efficient. The Radix coder however solves this by disclosing a method of coding values s whose range 1 to g (or 0 to g−1) may not be a power of 2 but for which the assumption that all values of s are equally likely is acceptable.

As is well known, Golomb Coding works well at least in part because the probability density of R is normally relatively flat, even in cases where the probability density of M is uneven or skewed. The skewness of the distribution may be largely represented in the distribution of E, although even that is generally well-behaved. There may be a smoothing effect on E because any value of E which is greater than 1 covers a range of $2^E$ different values of M. There may be a flattening effect on R because the number of values of R is less than the number of possible values of M.

One aspect of Golomb Coding is that a number, which might or might not be a run length, is coded in two parts, one by an exponent E whose probabilities may vary widely, and the other by a fraction of E bits which may have a relatively but not perfectly flat probability. One embodiment of the claimed subject matter may employ a radix coder to code the fractional part of a Golomb Code, particularly when the base K is not a power of 2. Additionally, in at least one embodiment, a buffer may be employed when encoding and/or decoding data, as will be explained in greater detail later.

As described in co-pending U.S. Patent Application Ser. No. 11/777,256, by Donald M. Monro, filed Jul. 12, 2007, titled, "Combinatorial Coding/Decoding for Electrical Computers and Digital Data Processing Systems", co-pending U.S. Patent Application Ser. No. 11/777,239, by Donald M. Monro, filed Jul. 12, 2007, titled "Blocking for Combinatorial Coding/Decoding for Electrical Computers and Digital Data Processing Systems", and/or co-pending U.S. Patent Application Ser. No. 11/777,230, by Donald M. Monro, filed Jul. 12, 2007, titled, "Blocking for Combinatorial Coding/Decoding for Electrical Computers and Digital Data Processing Systems", a combinatorial coder may achieve a run length or other code by coding in two parts, in which the probabilities of the first part r may vary widely as in Golomb Coding of E, but the probabilities of the second part s may be perfectly or nearly flat. This discovery allows very efficient run length coding, particularly if a method can be used to code the second part of the code s which is perfect or nearly perfect in the sense that exactly the theoretical cost of coding s can be achieved. The radix coder is one method of doing this in the case where the symbols can be sent in one long message. As will be described, a sequence of values of different radix may be coded in this way provided the coder and decoder can select the identical radix to be used for each value. However the radix coder in its basic form assumes that it may form a message whose length is sufficient to code all the data in a sequence, which may be very large. The present invention shows how to store or communicate the results of radix coding using a buffer of a limited size. However, it is worthwhile to note that the above-referenced co-pending U.S. patent applications describe one or more example embodiments, and the claimed subject matter is not so limited.

As described in the above-referenced co-pending U.S. patent applications Ser. No. 11/777,256, Ser. No. 11/777,239 and/or Ser. No. 11/777,230 a sequence of binary symbols of length n bits is selected and it is desired to code the occurrences of a particular binary symbol. This is similar to run length coding except that in principle several runs may be coded at once. That is to say, if there are r occurrences of the binary symbol in the sequence of n bits, the combinatorial coder described in the above-referenced co-pending U.S. patent applications Ser. No. 11/777,256, Ser. No. 11/777,239, and/or Ser. No. 11/777,230, codes runs of occurrences (or equivalently non-occurrences) of the binary symbol. In this example, a first binary symbol code r indicative of the number of occurrences of the binary symbol within the grouping of data to be compressed is generated, and a second binary symbol code s indicative of the pattern of occurrences of the binary symbol code is generated. Likewise, for further groupings of data, this may be repeated. Respective binary symbol codes may then be combined to form a data code. A resulting data code is a compressed form of the set or grouping of data. This data code may be transmitted or stored as desired.

As described in the above-referenced co-pending U.S. patent applications Ser. No. 11/777,256, Ser. No. 11/777,239 and/or Ser. No. 11/777,230, a combinatorial coder may operate efficiently with a small number of symbols and short groupings or blocks of data, as just an example. It may, for example, be useful when data is a sequence of Binary digits in which two states occur, such as 'on' and 'off', or 'red' and 'green' or 'guilty' and 'non guilty'. Such binary data may in particular embodiments be represented as a series of the digits '0' and '1'. Accordingly, a combinatorial coder such as described in the above-referenced co-pending U.S. patent applications Ser. No. 11/777,256, Ser. No. 11/777,239 and/or Ser. No. 11/777,230 can be used to code runs or patterns of binary data and is a viable alternative to previously know methods such as arithmetic coding or Golomb coding over which it has specific advantages as will be described. However, it is worthwhile to note that a radix coder in accordance with one or more embodiments is not limited in its application to a combinatorial coder or a Golomb coder or to any other application. Similarly the buffering of the Radix coder is not limited to any particular application of the radix coder and may be employed, for example, in any date coding implementation wherein a buffer may be suitable. However, again, it is worthwhile to note that the above-referenced co-pending U.S. patent applications describe one or more example embodiments, and the claimed subject matter is not so limited.

A radix coder may operate by taking an initial message which is empty and adding symbols $s_t$ to it which are indicative of values in a range $g_t$, said range or radix $g_t$ being indicative of the number of values that the particular symbol may take. As coding of symbols progresses the message grows in length. If the message is a binary number, as it grows the process that defines the code may cause many of the bits of the message to change as the message is constructed, so that the final bit pattern of the message is not known until all symbols have been coded.

In one embodiment of the claimed subject matter, a buffer of a particular length may be used to perform radix coding. In this embodiment, a message may be coded in the buffer. As the message is coded, in this particular embodiment, the coder knows the radix $g_t$ of the symbol $s_t$ to be coded next and can determine whether said new symbol would cause the message to grow larger than the capacity of the buffer. If the new symbol would cause the message to exceed the capacity of the buffer, for example, the coder can send the contents of the incomplete buffer to the decoder and start again with an empty buffer. The decoder may, of course, follow the coder step by step and may also know when there are insufficient bits in the buffer to define the next symbol, so that it will know when to receive a new buffer of data. However, this is just one example embodiment, and the claimed subject matter is not so limited.

Figure 2:
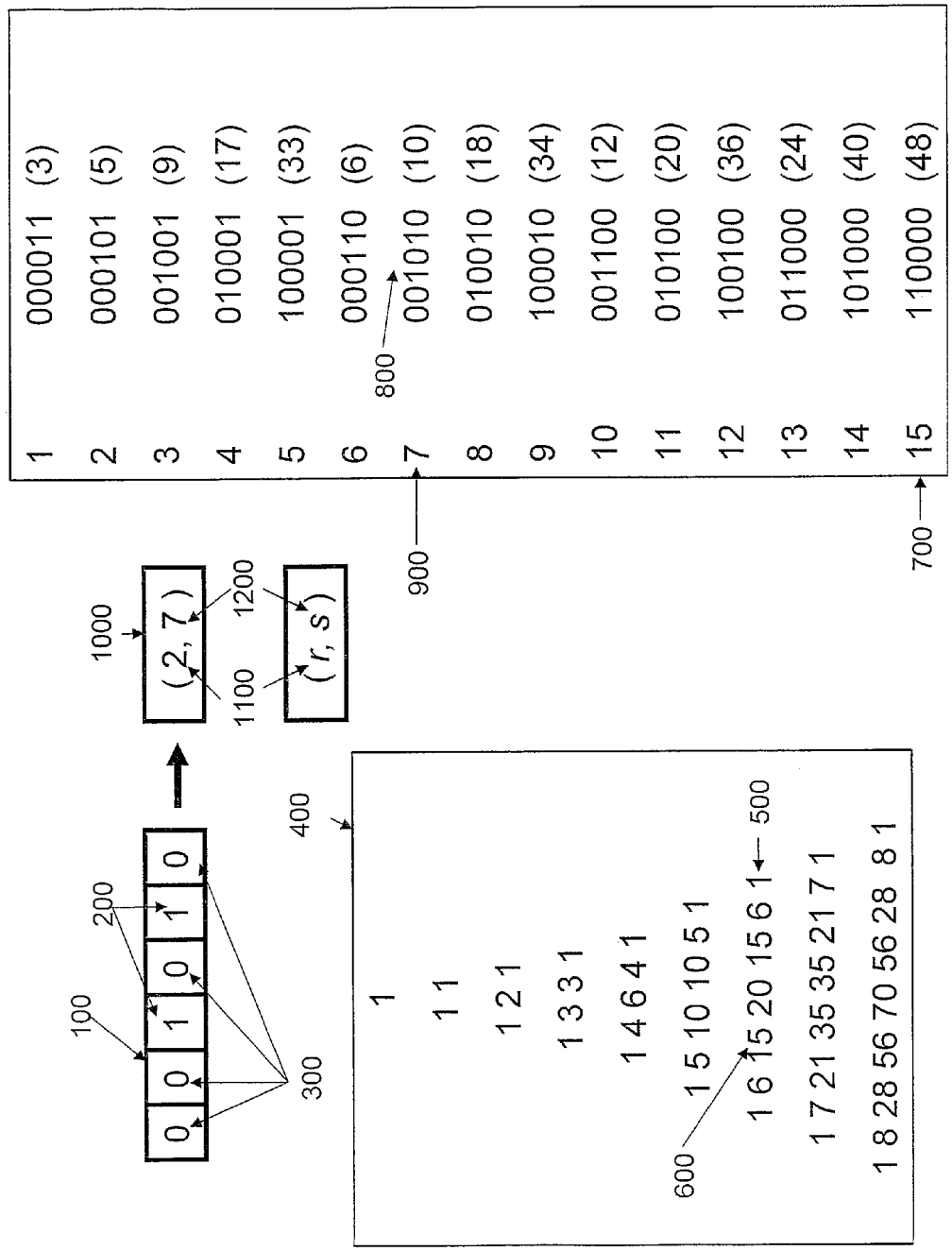
FIG. 2 is a diagram illustrating an example embodiment of a technique for data coding.

Referring now to FIG. 2, there is illustrated an example embodiment of coding data. In this embodiment, a sequence of 6 binary bits 100 are encoded by employing a combinatorial coder such as described in the above-referenced co-pending U.S. Patent Applications Ser. No. 11/777,256, Ser. No. 11/777,239 and/or Ser. No. 11/777,230. However, it is worthwhile to note that any length of sequence might be used and this is simply for illustrative purposes. In this embodiment, binary sequence 100 is a pattern which contains '0' bits in certain positions 200 and '1' bits in other positions 300. The coder may examine the binary sequence 100 and in particular may determine that there are two '1' bits 200 in the pattern. Although there are $2^6=64$ different patterns of 6 bits, as is generally known, there is a certain number of patterns or combinations of 6 bits including two '1' bits, usually called $_6C_2=15$, which is much less than 64. The table of numbers 400 is well known as Pascal's triangle, and lists all of the values of $_nC_r$ for row n from 0 to 8 with r counting across each row starting from 0. As is well known, each number in the triangle is the sum of the two immediately above it, so the table can be rapidly constructed, and also so that the sum of the numbers across row n is $2^n$, i.e. the number of different patterns of n bits. To code the binary sequence 100, the number of '1' bits is 2 and it is noted in Pascal's triangle 400 in row 6 that for r=2 at 600 there are 15 patterns corresponding to r=2. The 15 patterns are listed in table 700, from which it is found at 800 that pattern number 7 at 900 is the one corresponding to the data 100. The code for data 100 is therefore the two symbols at 1000 which are (2, 7), or in general (r, s). The code to describe data 100 is in two parts at 1000, a first code r 1100 that represents 2 and a second s 1200 that represents 7. This code may contain fewer than 6 bits and if so the data 100 is compressed by the code 1000. Equally the coder might have determined the number of '0' bits 300 as 4, which would give 4 as the first code r and one of 15 patterns with 4 zeros as the second code s, because $_6C_4$ is the same as $_6C_2=15$.

A combinatorial coder and decoder may refer to lists of patterns s for different lengths of sequences n and different numbers of '1' bits r within these sequences. In general there are $2^n$ different patterns of the data but only $_nC_r$ patterns with r bits, which is always less than $2^n$. The method relies on this fact, that $_nC_r$ is always less than $2^n$, to achieve compression. The lists of patterns may be ordered in any convenient way which enables the coder and decoder to select the same pattern s. Alternatively they may be calculated by a coder or decoder when advantageous. The method may be referred to as Combinatorial Coding because it is based on selecting ordered combinations to describe the positions of binary symbols in the data, in this case the binary symbol being the binary digit '1'.

Similarly, a coder and decoder may be employed with '0' bits. If there are r '1' bits in data of n bits, then there are n−r '0' bits. Accordingly, the first code would be n−r and the second code would indicate a pattern with n−r '0' bits. The number of patterns with n−r bits is $_nC_{n-r}$, which is always the same as $_nC_r$. The number of bits r may efficiently be coded by Huffman, Golomb, hybrid Huffman/Golomb as taught in U.S. pat. application Ser. No. 11/422,316, arithmetic coding or any other method. It is taught in U.S. patent application Ser. No. 11/422,316 that the hybrid Huffman/Golomb coder may outperform Huffman coding in some circumstances and that it even approaches the efficiency of Huffman coding with probability distributions that are ideal for Huffman coding. As the hybrid Huffman/Golomb coder is of low complexity, it may be used to code the number of bits r in an embodiment of this invention, although the claimed subject matter is not so limited.

The pattern number s may similarly be coded by Huffman, Golomb, hybrid Huffman/Golomb as taught in U.S. patent application Ser. No. 11/422,316, arithmetic coding and/or the like, including methods not described in detail. In this embodiment, once r is known, all the $_nC_r$ possible patterns are equally likely. Were $_nC_r$ a power of 2, the coder could do no better than code s by $\log_2(_nC_r)$ bits, as will be known to any practitioner skilled in the art. Sometimes this occurs, and sometimes $_nC_r$ is just less than a power of 2. In both these instances, as they arise, the coder may simply use $\log_2(_nC_r)$ bits without further coding. Efficient coding of $_nC_r$ equally probable outcomes when $_nC_r$ is not a power of 2 is done by the radix coder.

Gradually, in this manner, a set of data may be coded. As coding proceeds, a coder may transmit to a decoder information about binary symbols that have been located, such as position(s), in real time for some embodiments. Alternatively, coded data may be stored locally as a compressed representation.

The Combinatorial coder may be expressed in pseudo-code as follows:

For A=Binary symbol
        Indicate R=Number of Occurrences of A
        Indicate the particular pattern S of R Occurrences
    End In one embodiment, a radix coder may be employed to code symbols whose range may not be a power of 2 but whose probabilities are equally likely, or nearly equally likely, or acceptably equally likely. Consider a sequence of symbols s whose range is 0 to g−1, in which g comprises the radix of the code. A message m may be formed which may comprise a very large integer number into which symbols may be coded. Initially, m may be set to zero. However in considering buffering of the coded symbols, one may equally well consider m to be a message buffer, which may be filled up by the coded data until its capacity is reached or nearly reached, and its contents are stored or communicated before coding continues with a new, empty message buffer. As is well known, a computing device may represent integer numbers by using a 'word' consisting of a certain number of bits, which may be limited. However it is well known that arbitrarily large numbers can be represented by using multiple words. Methods of representing arbitrarily large numbers and performing arithmetic operations on them are not described herein but it is known to experts in the field that it is possible and feasible to do so. In one embodiment of the claimed subject matter, a number may be accumulated which may also be large, the accumulated radix of which may be referred to as a.

Figure 3:
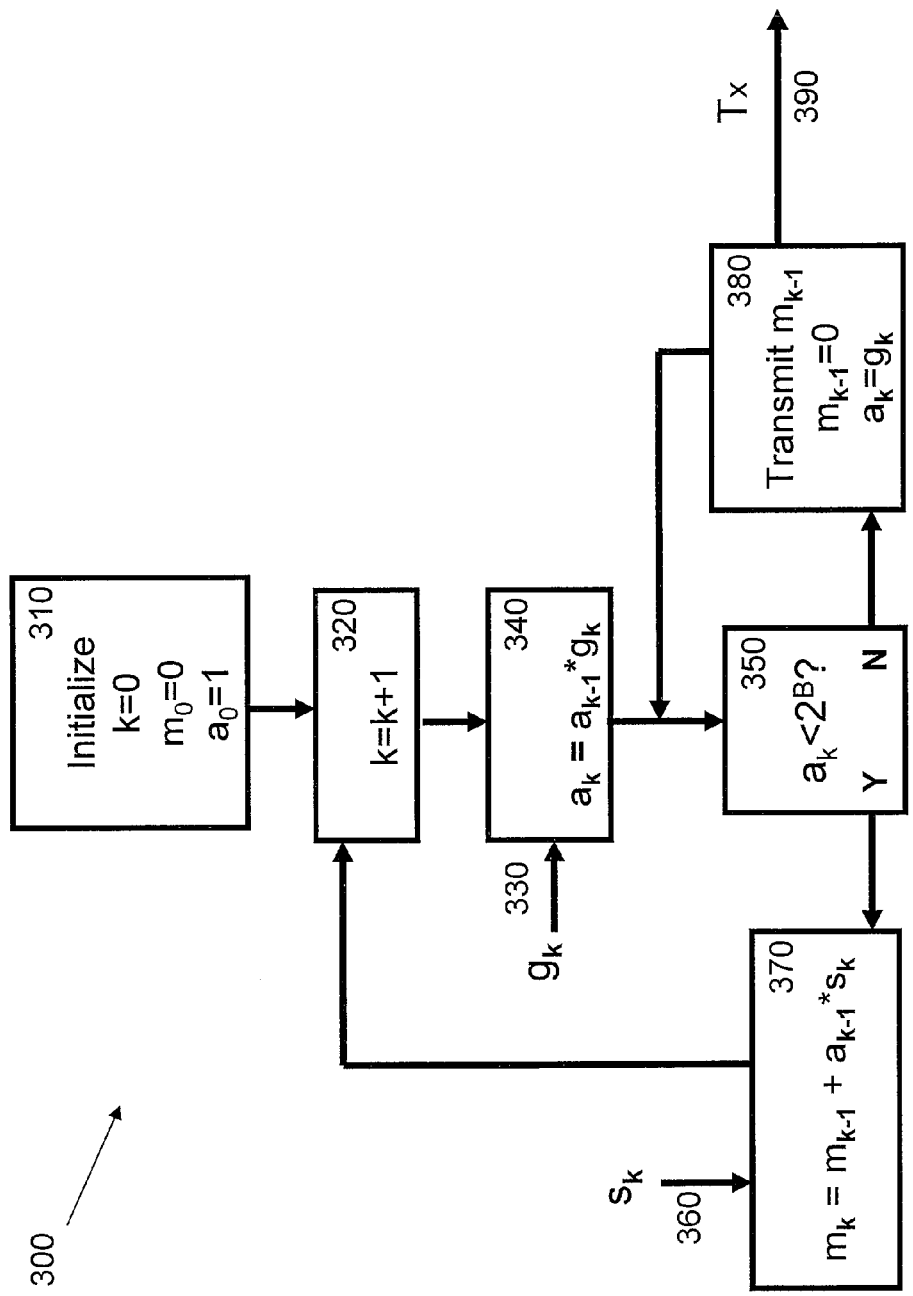
FIG. 3 is a diagram illustrating an example embodiment of a technique for data coding.

In accordance with one embodiment, a method of buffering data symbols from a sequence of data symbols may be performed. The data symbols may each have a radix, for example. In this embodiment, a maximum value resulting from coding a data symbol of the sequence into a buffer may be determined. The maximum value may be based, at least in part, on a radix of the data symbol being coded. The maximum value may be compared with a capacity of a buffer, and the data symbol to be coded may be scaled based at least in part on the radix. For example, if the maximum value does not exceed the buffer capacity, the scaled data symbol may be coded into the buffer. Furthermore, one or more portions of the method may be repeated for one or more additional data symbols of the sequence. However, the claimed subject matter is not so limited. As one example, as illustrated in FIG. 3, a flow diagram of an example process 300 of coding a number from 0 to g−1 according to an embodiment is illustrated. However, initially, it is worthwhile to note that a range of 0 to g−1 may be equivalent to coding numbers in the range 1 to g, as conversion from one range to the other can be accomplished by subtracting 1 before coding and adding one after decoding. In this embodiment, initially, the value of the message or message buffer m is set to zero. This may be referred to as $m_0$. The accumulated radix is initially set to 1, and this may be referred to in this embodiment as $a_0$.

To insert a first symbol $s_1$ into the code, it is simply added to $m_0$ to give $m_1$, i.e.

$$m_1 = m_0 + s_1$$

Of course, knowing that $m_0=0$, one could have simply started with $m_1=s_1$

The values of g multiplied together are accumulated, i.e.

$$a_1 = a_0 * g$$

Of course, knowing that $a_0=1$, one could simply make $a_1=g$

Now the range of $s_1$ is 0 to g−1, so there is no ambiguity in the code if we add a second symbol by $$m_2 = m_1 + a_1 * s_2 \qquad (1)$$

In a binary digital apparatus, the bits representing $s_1$ and $s_2$ can not in general be separated in a simple way, as they could be in the case where g is a power of 2, by shifting $s_2$ left before adding it to $m_1$. At least some of the bits of the message are likely to change when $a_1 * s_2$ is added to $m_1$ so that merely extracting the bits of the code will not decode the message. However what has been added to $m_1$ is a multiple of $a_1$, so the remainder after integer division of $m_1$ by $a_1$ has not changed, and is $m_1 = s_1$.

This process may be repeated to code as many values of s as is advantageous. In general if t−1 symbols $s_1 \ldots s_{t-1}$ of range 0-g, $s_1 \ldots s_{t-1}$ have previously been coded into a message $m_{t-1}$, another symbol $s_t$ may be coded by:

$$m_t = m_{t-1} + a_{t-1} * s_t \qquad (1a)$$

The accumulated radix $a_{t-1}$ is the product of all the radices up to t−1, and if all these radices are the same value g, $$a_{t-1} = g^{t-1} = g * a_{t-2}$$

So that the next accumulated radix can be formed as $$a_t = g_t * a_{t-1} \qquad (1b)$$

Equations 1a and 1b describe a radix FIFO coder with fixed radix g. It will, of course, be understood that once $m_{t-1}$ has been used to calculate $m_t$, $m_{t-1}$ is no longer required in this embodiment. Similarly once $a_{t-1}$ has been used to calculate $a_t$, $a_{t-1}$ is no longer required. Therefore a saving in memory is achieved by reusing the message and the accumulated radix.

Calling the message m, and the accumulated radix a, both are recalculated as each symbol $s_t$ is coded i.e. by a recurrence:

$$m = m + a * s_t \qquad (2a)$$

and $$a = g * a \qquad (2b)$$

In this embodiment, recurrence 2a may be carried out before recurrence 2b, because 2b modifies the value of a which is required by 2a. It will also be evident that in the case where the value of g is always the same, 2b is the same as $a = g^t$, although, in some embodiments, the recurrence may be a more computationally efficient way of carrying out this calculation, by having fewer steps, for example.

In at least one embodiment, a radix coder may also be extended to comprise a multiradix coder. It is a further aspect of an embodiment of a radix coder that the radix g used with successive values of s does not need to be the same. Referring, for example, to the combinatorial coder, it will be evident that the value of r will change as successive groups of binary symbols are coded, and each time the range of s will be $0-{}_nC_r$. Provided the coder can communicate the value of r to the decoder, it is possible to change the value of r as often or as seldom as necessary. Also referring to the Golomb Coder, the range of the residual R depends on exponent E. R may comprise a number in the range 0 to $K^{E-1}$. This is a number which may be suitable for coding by the radix coder. In one embodiment, an assumption may be made that the radix $g=K^E$ or alternatively the value of E may be communicated by some means to the decoder. Alternatively, the radix $g=K^E$ may be otherwise determined by the decoder in response to received information, and/or in one or more other ways not described in detail.

As each symbol $s_t$ is coded, a different radix $g_t$ may be used. In this way the radix g may change as often as is advantageous for the particular coding task. The variable radix FIFO coder may therefore be expressed as:

$$m = m + a * s_t \qquad (3a)$$

followed by $$a = g_t * a \qquad (3b)$$

It is worthwhile to note that in this embodiment, a−1 is the maximum numerical value of the message in the buffer. If the message is being coded into a buffer of finite length, B bits as in FIG. 5, the maximum number that the message can represent before exceeding the capacity of the buffer is $2^B-1$. Initially with the buffer empty the maximum it may contain is 0. As coding proceeds, the coder may calculate (product of the radices−1) which at all times is the maximum value that might have been coded. After a first symbol of radix $g_1$ has been coded, the maximum value of the message is $g_1-1$. As may be seen from this embodiment, the buffer size may be configured to be large enough to accommodate the largest value of $g_1-1$ that can occur. It need not, however be large enough to accommodate the largest symbol twice, for example. Assuming it is large enough to hold two symbols, after a second symbol of radix $g_2$ has been coded into the buffer by the process described by equation (3), the maximum value of the message is $a_2 = g_1 * g_2 - 1$, and so on, so that after symbol $s_{t-1}$ has been coded, the maximum is $g_1 * g_2 * \ldots * g_{t-1} - 1$. Before coding symbol $s_t$, the coder may check that $g_1 * g_2 * \ldots * g_{t-1} * g_t - 1$ will not be larger than $2^B-1$. If it is larger, then the coder may communicate or store all B bits of the buffer, which contains the codes of t−1 data values, and start a new, empty buffer with initial value 0, and a new maximum coded value of 0, into which it codes what would have been $s_t$ of radix $g_t$, now as $s_1$ of radix $g_1$. The coder may continue coding symbols and restarting the buffer as many times as may be advantageous to code the data in its entirety or at least partially. Of course, in this example, the buffer, which is finite, has not been completely filled. The length of the radix code may be increased slightly with each buffer that is restarted. Although the radix coder may, in principle, achieve perfect coding of a long stream of symbols of mixed radix provided the probabilities are flat, in practice if a finite buffer is used according to embodiments described herein the length of the coded data may exceed the theoretically minimum length. However as will be seen the amount of this increase may be estimated and a buffer length B may be determined to limit this increase to any desired amount by making the buffer sufficiently long.

Embodiments of a decoding process will now be described. Continuing the example where there are only two symbols coded of radix g, the first symbol coded, $s_1$, may be recovered by extracting the remainder when $m_2$ is divided by g:

$$s_1 = \mod(m_2, g)$$

where the mod function calculates the integer remainder when $m_2$ is divided by g. This is easily seen to be identical to the calculation:

$$s_1 = m_2 - g * \text{fix}\left(\frac{m_2}{g}\right)$$

where $$\text{fix}\left(\frac{m_2}{g}\right)$$

rounds the quotient $$\frac{m_2}{g}$$

to the integer of next lowest magnitude. At the same time a message containing $s_2$, which can be called $m'_2$ can be recovered by:

$$m'_2 = \text{fix}\left(\frac{m_2}{g}\right)$$

It is noted that this is not the same as the message $m_2$ which would have been formed if $s_2$ were the first symbol coded. The symbol $s_2$ may be recovered from $m'_2$ by:

$$s_2 = \mod(m'_2, g)$$

In the general case, if we have a message $m'_t$, then we may recover $s_t$ and $m'_{t+1}$ from it by:

$$s_t = \mod(m'_t, g) \tag{4}$$

and $$m'_{t+1} = \text{fix}\left(\frac{m'_t}{g}\right) \tag{5}$$

Equations 4 and 5 represent a fixed radix g FIFO decoder for the radix g FIFO encoder of equation 1a and 1b. As with coding, in decoding we may reuse message m as the decoding proceeds. Starting with m as the entire message as coded, then starting with t=1, all the symbols coded may be recovered by the recurrence:

$$s_t = \mod(m, g) \tag{6}$$

$$m = \text{fix}\left(\frac{m}{g}\right) \tag{7}$$

Equations 6 and 7 describe a decoder for a coder described by equations 2a and 2b. In the case of equations 3a and 3b, where the radix g may vary from symbol to symbol, the decoder is described by:

$$s_t = \mod(m, g_t) \tag{8}$$

$$m = \text{fix}\left(\frac{m}{g_t}\right) \tag{9}$$

Similarly to embodiments of coding described above, the decoder may accumulate the product of the radices a to determine when there is no more data to be decoded in the buffered message. In one embodiment, as decoding proceeds, the decoder calculates (product of the radices−1) which at all times is the maximum value that might have been previously decoded. If the message is being decoded from a buffer of finite length, B bits as in FIG. 5, the maximum number that the buffer can represent before exceeding the capacity of the buffer is $2^B-1$. Initially the decoder acquires a buffer of B bits, without knowing how many coded symbols the buffer contains. After a first symbol of radix $g_1$ has been decoded, the value of the message will have been greater than or equal to $g_1-1$. Although the buffer used may be large enough to accommodate the largest value of $g_1-1$ that can occur, it need not be large enough to accommodate the largest symbol twice, for example. Assuming the buffer is large enough for the first two symbols, after a second symbol of radix $g_2$ has been decoded from the message buffer by the process described by equations (8) and (9), the message will have been greater than or equal to $g_1*g_2-1$, and so on, so that after symbol $s_{t-1}$ has been coded, the maximum is $g_1*g_2*\ldots*g_{t-1}-1$. Before decoding symbol $s_t$, the coder may check that $g_1*g_2*\ldots*g_{t-1}*g_t-1$ will not be larger than $2^B-1$. If it is larger, then the decoder will know that the coder started a new buffer at this point. The decoder has decoded the same t−1 data values as were coded by the coder. The coder may then acquire a new buffer of B bits from which it may continue decoding symbols, and may restart the calculation of (product of radices)−1. The decoder may refresh the buffer a number of times to code the data in its entirety. It is easily understood that in all the equations representing the coding of the data into a buffer, the buffer may be reused as often as is advantageous provided it is stored or communicated before the buffer is restarted.

Taking a specific numerical example, a buffer may consist of 5 bits, in which case the largest value it can hold would be 31. Suppose the radix g=5, and begin with the empty buffer $m_0=0$. Before coding, the maximum value that the buffer can contain is 0. If the first number to be coded into the buffer, $s_1$, is 3, then $m_1=3$, and the maximum that could have occurred is 4. To code a next number $s_2=4$ we calculate $m_2=3+5*4=23$. In effect the numbers 3 and 4 are contained within the value 23, which is within the capacity of the buffer. One experienced in the field would recognize that 23 converted to base 5 would be $4_5 3_5$. The maximum possible value that might have been coded into the buffer at this point is 5*5−1=24 (which is $4_5 4_5$). To code a third number of radix 5 would give a maximum value of 5*5*5−1=124 which would exceed the buffer capacity. Therefore the coder may at this point store or communicate the value 23 before coding the third number into a new, empty buffer. To decode, the first digit coded, $s_1$, is recovered by mod(23,5) which is 3, and $s_2$=fix(23/5)=4. At this point the maximum value that the buffer could have contained is 24, and before decoding a third value, the decoder determines that the new maximum would be 124, which is beyond the capacity of the buffer. The decoder therefore would acquire a new buffer and restart the maximum value calculation. Of course, this is just an example, and the claimed subject matter is not so limited.

Figure 4:
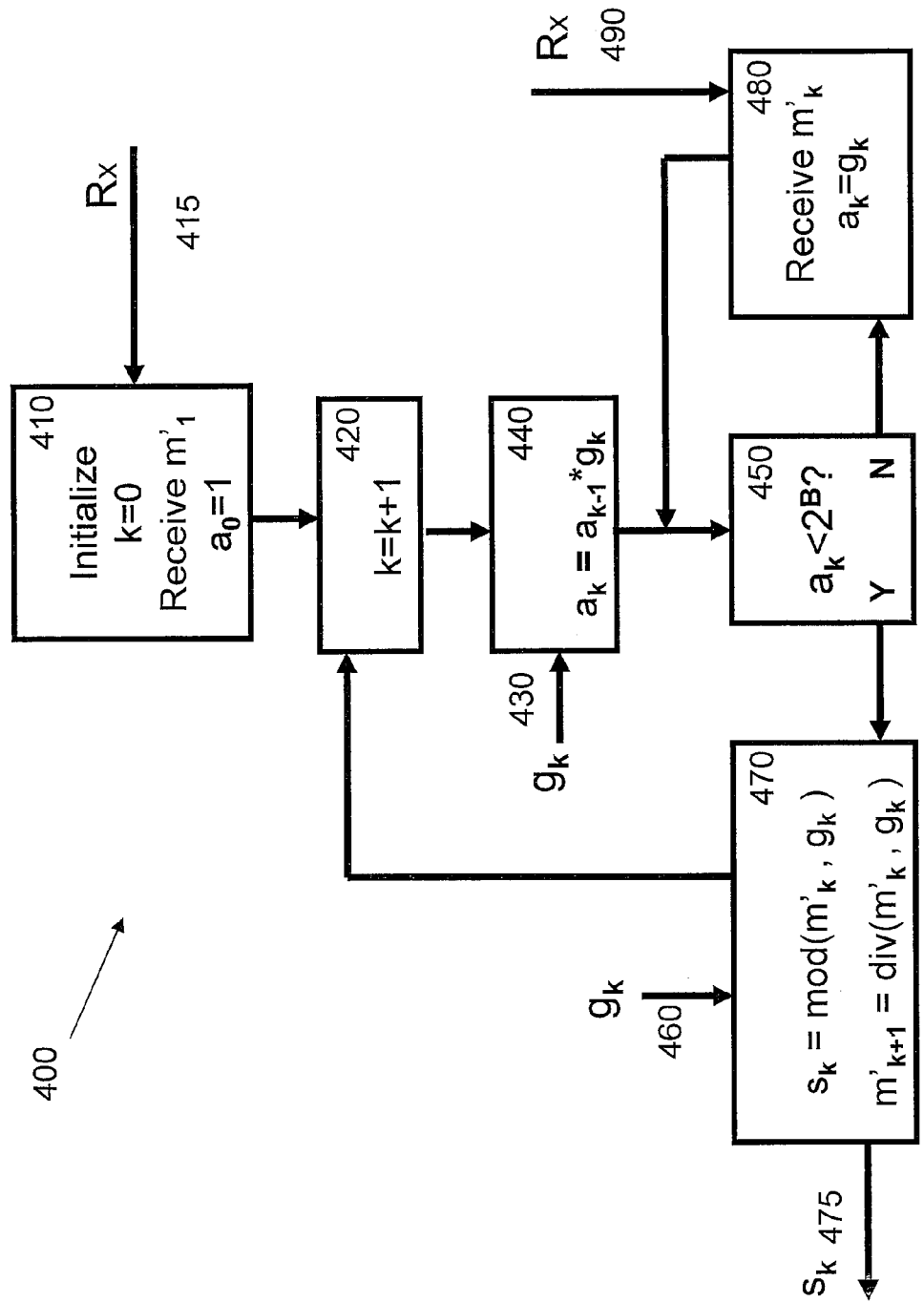
FIG. 4 is a diagram illustrating an example embodiment of a technique for data decoding.

Continuing with FIG. 3, an embodiment of the buffered Radix coder 300 which implements the embodiments of the Radix coder of equations 3a and 3b will be described. A buffer of capacity B bits holds a coded value equal to m. The buffer is not shown explicitly in FIG. 3 but is referred to with reference to its held value m. The initialization of a coding task may be carried out by processing block 310, which sets the current symbol number to be coded k=0, and assigns the initial value of the buffer to be empty $m_0$=0, and assigns the initial buffer maximum value to be $a_0$=1. At processing block 320, current symbol number k may be incremented by 1, k=k+1. Radix $g_k$ of current symbol $s_k$ may be provided as input 330 to processing block 340 which may accumulate what the buffer maximum value $a_k$ would be if symbol $s_k$ were coded into the current buffer $m_{k-1}$, said accumulated buffer maximum value being $a_k = a_{k-1}*g_k$. Comparison block 350 compares accumulated buffer maximum value $a_k$ to the value $2^B$ which would exceed the maximum value that buffer $m_k$ can hold. If $a_k < 2^B$ then current symbol $s_k$ 360 is coded by processing block 370 to produce an updated buffer $m_k = m_{k-1} + a_{k-1}*s_k$, and processing returns to processing block 320 where current symbol number k may be incremented by 1, k=k+1. In this manner a sequence of symbols $s_k$ may be coded into buffer $m_k$ until the comparison block 350 detects that the buffer capacity B bits would be exceeded. If $a_k \geq 2^B$, processing block 380 causes the buffer $m_{k-1}$ to be stored or transmitted 390 to a decoder 400 such as is shown in FIG. 4. Processing block 380 may reset buffer value $m_{k-1}$ to the empty condition $m_{k-1}$=0 and accumulated buffer maximum $a_k$ may be set to the maximum accumulated buffer value $g_k$ that could occur when $s_k$ is coded into the buffer. Processing then may return to processing block 350 although it could equally well go directly to processing block 370, as it is understood that as long as no radix $g_k$ in block 380 exceeds the buffer capacity the coding of $s_k$ may be accomplished directly by block 370. If any $g_k$ at 380 exceeds the buffer capacity an error has occurred, and the coding would become stuck by cycling between processing blocks 350 and 380. It will be clear to one skilled in the art that there is a choice between continuing with an error as would occur if processing block 380 passed control to processing block 370, or terminating coding when such an error occurs. Optionally additional circuitry may be provided to detect this situation and take appropriate action. Precisely what constitutes appropriate action would depend on the circumstances of an embodiment and the claimed subject matter is not so limited. Coding of symbols $s_k$ 360 into buffer m as $m_k$ may continue until as many symbols as desired have been coded into buffers. Any incomplete buffer may, of course, be stored or transmitted at the conclusion of coding.

Referring now to FIG. 4, there is illustrated a flow diagram of an example embodiment of a process 400 of an example radix decoder which may decode buffered messages, such as message 390 of FIG. 3. However, it is worthwhile to note that the claimed subject matter is not limited in this respect. In this embodiment, initialization of a coding task may be carried out by processing block 410, which may set a current symbol number to be decoded k=0, receive an initial B bits into initial buffer m'$_1$, and assign initial buffer maximum value $a_0$=1. At processing block 420, current symbol number may be incremented by 1, k=k+1. Radix $g_k$ of current symbol $s_k$ may be provided as input 430 to processing block 440, which may accumulate what the buffer maximum value $a_k = a_{k-1}*g_k$ would be if symbol $s_k$ had been coded into buffer m'$_k$, for example. Comparison block 450 may compare accumulated buffer maximum value $a_k$ to the value $2^B$ which would exceed the maximum value that buffer m'$_k$ can hold. If $a_k < 2^B$, processing block 470 may decode current symbol $s_k$=mod(m'$_k$, $g_k$) 475 and update buffer m'$_{k+1}$=div(m'$_k$,$g_k$), and processing may return to processing block 420 where the current symbol number k may be incremented by 1, k=k+1. In this manner a sequence of symbols $s_k$ may be decoded from buffer m'$_k$ until the comparison block 450 detects that the buffer capacity B bits would be exceeded. If $a_k \geq 2^B$, processing block 480 may receive at 490 a new buffer m'$_k$ of B bits and accumulated buffer maximum $a_k$ is set to the maximum accumulated buffer value $g_k$ that could occur if $s_k$ is decoded from the buffer m'$_k$. Processing then may return to processing block 450 although, alternatively, processing may go directly to 470, if, for example, no radix $g_k$ exceeds the buffer capacity for the decoding of $s_k$. In this embodiment, if any $g_k$ exceeds the buffer capacity, an error has occurred, and the decoding will become stuck by cycling between processing blocks 450 and 480. If an error occurs, a selection may be made between continuing with an error as would occur if processing block 480 passed control to processing block 470, or terminating decoding when such an error occurs. Optionally, additional circuitry may be provided to detect the occurrence of an error, and/or to be responsive to the occurrence of an error by taking an appropriate action. An appropriate action may depend at least in part on the circumstances of the error and/or events causing the error, and the claimed subject matter is not limited in this respect. Decoding of symbols $s_k$ 475 may continue sequentially until as many input buffers have been processed as may be advantageous.

Figure 5:
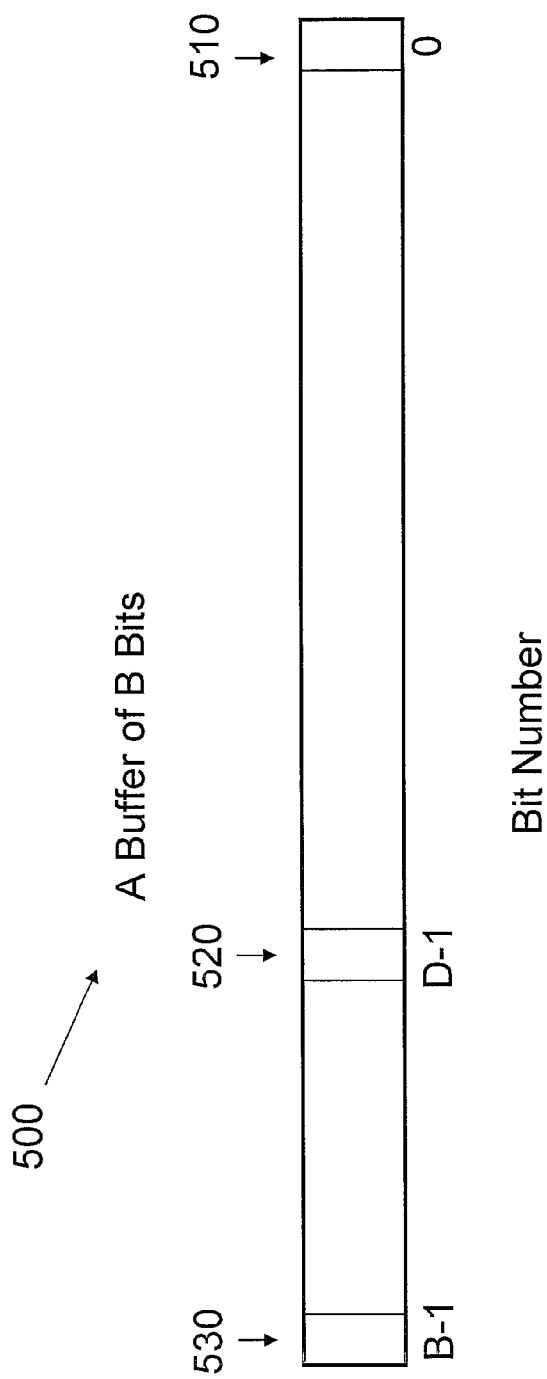
FIG. 5 is a diagram illustrating an example embodiment of a technique for data buffering.

Referring now to FIG. 5, there is illustrated an example embodiment of a buffer 500 of B bits such as m'$_k$ 460 in FIG. 4. The bits are numbered from bit 0 510 to the maximum available bit B-1 530. At a stage in the decoding process, radices $g_1, g_2, g_3, \ldots g_{v-1}$ have been used in decoding symbols from buffer 500. The comparator 430 in FIG. 4 has determined that $g_1*g_2*g_3* \ldots *g_{v-1}$ is less than $2^B$, so that symbols $s_1, s_2, s_3, \ldots s_{v-1}$ have been decoded from this buffer. If fix($\log_2(g_1*g_2*g_3* \ldots *g_{v-1})$)=D, then the maximum bit number that has been used in decoding $s_1, s_2, s_3, \ldots s_{v-1}$ is D-1 520. If a next radix $g_v$ causes the product $g_1*g_2*g_3* \ldots *g_{v-1}*g_v$ to be greater than or equal to $2^B$, the next symbol $s_v$ cannot be decoded from this buffer and a new buffer may be acquired for processing to continue with this $g_v$ as the new $g_1$ from which $s_v$ may be decoded as the new $s_1$. In at least one embodiment, whenever g is a power of 2, say $g_t=2^b$, multiplying m by $g_t=2^b$ is the same as shifting m to the left by b bits. However, the claimed subject matter is not so limited.

For convenience, it may be desirable to represent binary numbers with the least significant bit, signifying value 0, at the right hand end of the binary number. Of course, this may be an accepted notation for representing binary numbers, but may not comprise an exact representation of their organization when implemented in hardware and/or software, for example. In one embodiment, this accepted notation may be utilized if g is a power of 2, and the FIFO radix coder may be implemented by shifting the value of s to the left before adding it to message buffer m. The bits of s could, of course, be taken in any order, such as reverse, the claimed subject matter is not so limited. The decoder having information regarding the radix g of the next data to be decoded may be advantageous in Golomb coding by being able to interleave the values of S and E with the residual R. The coding of E may be by any convenient method, for example by a variable length code such as a Huffman or other code, or an arithmetic code, and can be interleaved with the coding of R according to the present invention. The sign S is capable of representation by a single bit and so in many cases it may be coded by employing a single bit. However, if the signs S are unevenly distributed, the interleaved coding may be by some other method, for example arithmetic or run length coding. The coding of E interleaved by an embodiment may be by any method and is not to be limited by the examples given here. It may be advantageous in coding by the combinatorial coder by interleaving the coding of the bit counting symbol r with the coding of the symbol s. The coding of r may be by any method including a variable length code such as a Huffman or other code, or by arithmetic coding to give but two examples. The coding of r interleaved by an embodiment may be by any method and is not to be limited by the examples given here.

Binary data may comprise a fixed number of b binary bits, or it may comprise a variable number of bits such as may be coded by a variable length code. If the number of bits is known and is b, then simply code the bits as a value of $s_t$ in the range 0 to $2^b-1$, using an embodiment with $g_t=2^b$. If the bits arise from a variable length code, they may be inserted one at a time by using an embodiment with $g_t=2$. If decoding, the bits comprising the interleaved data may become available at the least significant end of the message, and may be recovered or decoded by shifting them out to the right into a decoded value. However as soon as a radix $g_t$ occurs which is not a power of 2, the interleaved data may no longer be separated in the message as a sequence of b bits. In the decoding process, however, if the decoder comes to a radix that is a power of 2, the bits may be available at the right hand end of the message and may be extracted by a decoder by shifting.

It may be desirable to predict the efficiency of a coding process. For example, binary notation may assist the prediction of the efficiency of the coding process including the effect of using a particular length of buffer as in one or more embodiments described herein. Working with '1' as the coded digit, let the probability of occurrence of a '1' be q over both long and short blocks of binary data, i.e. q is stationary. As is well known to practitioners in the field, the theoretical cost, or entropy, of coding of each bit from this data may be expressed as:

$$e_q(1) = -q \log_2(q) - (1-q)\log_2(1-q)$$

The entropy, or theoretical cost of coding each bit by an efficient method may be expressed may be as:

$$e_q(n) = -\sum_{r=0}^{n} p_q(r)\log_2 p_q(r) \text{ bits.}$$

At $n = 1$ this gives the identical result to $e_q(1)$, and with other values of n the theoretical total cost of coding n bits is $ne_q(n)$ bits. In a block of n bits, then, the probability of one particular pattern in which r bits are '1' may be expressed as:

$$p_q(r) = q^r(1-q)^{n-r}$$

However $_nC_r$ different patterns of r bits from n might occur. The Combinatorial coder may consider the different patterns that might occur. The probability of any of the possible $_nC_r$ patterns of r bits from n is $c_q(n,r) = {_nC_r} p_q(r)$, so that the theoretical cost of using the Combinatorial coder may be calculated as the cost of selecting a value of r and the cost of sending the selected pattern s. Because each pattern of r bits is equally probable, coding the pattern number s by a perfect method would cost $\log_2 r$ bits. Therefore using the probability of each value of r, the theoretical cost of using the method to code n bits may be expressed as:

$$e_q^*(n) = -\sum_{r=0}^{n} c_q(n,r)\log_2(c_q(n,r)) + \sum_{r=0}^{n} c_q(n,r)\log_2(_nC_r)$$

It may be shown that $e_q^*(n) = ne_q(n)$, i.e. that a perfect method of coding r and s will achieve perfect coding of the binary data. An embodiment of a Radix coder may be therefore capable of perfect compression performance if q is constant.

The total theoretical pattern cost of a message of N symbols $s_n$ each with radix $g_n$ is:

$$\sum_{n=1}^{N} \log_2 g_n$$

The coded data may be efficiently communicated or stored by the radix coder as one long message. In practice this is possible within one bit of the total theoretical value, simply by sending all the bits necessary to describe the message. For example if the message has a theoretical cost of 465328.67 bits, it would be possible to achieve this in 465329 bits. In a practical application or for convenience a system might increase this further to be an exact number of bytes or words or blocks, but in principle efficiency to the rounded up exact number of bits is achievable. This would be true if the coder and decoder knew in advance the length of the message and the radices to be used. It does not include the cost of sending the radices g, or the cost of sending the length of the message or alternatively of terminating it by some special code. As can be seen from the foregoing description, embodiments of the claimed subject matter may be employed when it may not be convenient or possible to construct or store or communicate or receive or decode a long sequence of values using the radix coder, by teaching how a buffer may be used. However, it is worthwhile to note that the claimed subject matter is not so limited.

Turning to a combinatorial coder, a prediction may be made regarding the most efficient number of bits n to code together. Furthermore, a calculation of the overall efficiency of the combinatorial coder may be made, as may be a calculation of an average number of bits unused in a buffer of any size according to embodiments described herein. Recalling that the first code r of the combinatorial coder is not perfect, and that the second code s is done by the radix coder, it is possible to work out the theoretical performance of the combinatorial coder and to select an optimum value for n. The code of a binary word comprises two-parts, the first binary symbol code, or selection code, to select r which specifies the number of occurrences of the binary symbol in the word and the second binary symbol code, or pattern code, to specify s which specifies which of the $_nC_r$ patterns of r bits occurs in the word. The radix coder for pattern selection s with radix $g={}_nC_r$ may achieve the theoretical compression or entropy, so the coding of s may be taken as exactly the theoretical cost in this example. The effect of the buffer may then be considered. All values of s for this example from 1 to ${}_nC_r$ are equally likely, so the number of bits required to code a particular value of s is therefore $\log 2({}_nC_r)$. The probability of a particular value of r may be expressed as:

$${}_nC_r p_q(r) = {}_nC_r q^r (1-q)^{n-r}$$

and so the cost of coding s, i.e. the pattern cost which may be achieved in this example may be expressed as:

$$\sum_{r=0}^{n} {}_nC_r q^r (1-q)^{n-r} \log 2({}_nC_r)$$

For example if n were 6, applying the above formula shows that the ideal pattern cost would be 2.79 bits, to two places of decimals.

In this example a simple Variable Length Code (VLC) may be used for the first code which selects a value of r between 0 and n. In this VLC, which in many cases is equivalent to a Huffman Code, the most probable value of r may be selected by a single bit, as is known to those skilled in coding of data. Either binary '1' or binary '0 may be used as the terminating bit for the VLC, and in either case the opposite, binary '0' or binary '1' may be used prior to the terminating bit. The number of bits including the terminating bit may determine the value communicated by the VLC. The cost of selecting the second most probable value of r will be 2 bits, either 10 or 01, and similarly the cost of selecting the third most probable value of r will be three bits, either 110 or 001, and so on. To calculate the cost for a particular value of q, the probabilities of each value of r which are ${}_nC_r p_q(r) = {}_nC_r q^r (1-q)^{n-r}$ are calculated and sorted into descending order. For example, with q=0.25 and n=6, the probabilities may be expressed as:

| r = | 0 | 1 | 2 | 3 | 4 | 5 | 6 |
|---|---|---|---|---|---|---|---|
| Probabilities = | 0.1780 | 0.3560 | 0.2966 | 0.1318 | 0.0330 | 0.0044 | 0.0002 |

And sorted into descending order these are

| r = | 1 | 2 | 0 | 3 | 4 | 5 | 6 |
|---|---|---|---|---|---|---|---|
| Sorted = | 0.3560 | 0.2966 | 0.1780 | 0.1318 | 0.0330 | 0.0044 | 0.0002 |

Continuing the current example, the number of bits assigned to each for the VLC is

| r = | 1 | 2 | 0 | 3 | 4 | 5 | 6 |
|---|---|---|---|---|---|---|---|
| Sorted = | 0.3560 | 0.2966 | 0.1780 | 0.1318 | 0.0330 | 0.0044 | 0.0002 |
| VLC Bits = | 1 | 2 | 3 | 4 | 5 | 6 | 7 |

The theoretical cost of the VLC for this case, q=0.25 and n=6, may be obtained by adding up the corresponding probabilities multiplied by the length of the VLC. This gives:

$$0.3560 + 2*0.2966 + 3*0.1780 + 4*0.1318 +$$
$$5*0.0330 + 6*0.0044 + 7*0.0002 = 2.2034 \text{ bits}$$

The ideal theoretical cost of selecting r may be expressed as:

$$\sum_{r=0}^{n} {}_nC_r q^r (1-q)^{n-r} \log 2({}_nC_r (1-q)^{n-r})$$

If n=6, the ideal theoretical cost is 2.0787 so the VLC selection cost is 6.0% greater than the ideal theoretical cost. However, adding both the first selection cost for r and the second pattern costs gives a practical cost of using the VLC of 4.9923 to code 6 bits compared to the theoretical ideal total cost of 4.8677, from which it is seen that in this example the coder is predicted to achieve a compressed number of bits which is 2.6% above the theoretical minimum possible.

By a similar calculation it may be seen that for a given probability q it is possible to select the first and second coding methods and the word or block length n to give the predicted compression which is lowest, i.e. closest to the theoretical minimum. It is also possible from these calculations or similar ones to work out the required buffer length to achieve a desired overall coding efficiency. This may be performed subject to any other constraint such as a limit on n or any other characteristic of the method.

An evaluation of an effect of a finite buffer may be made in one embodiment. In general if a radix $g_t$ occurs, the number of bits theoretically required to communicate a symbol $s_t$ which may take $g_t$ equally probable values is $\log_2(g_t)$. This is an exact number of bits only if $g_t$ is a power of 2. Because in one or more embodiments described herein the buffer is being communicated only partially full, and if coding a new symbol $s_t$ with a particular radix $g_t$ would cause it to overflow, the average number of bits unused in the buffer when it terminates at a radix $g_t$ is $\log_2(g_t)/2$. This is divided by 2 because when $g_t$ occurs the symbol may fit within the buffer length, or it may exactly fit the buffer length, or it my exceed it by any amount up to $\log_2(g_t)$. All possibilities from 0 to $\log_2(g_t)$ are equally likely so that the average overflow by a symbol of radix $g_t$ is $\log_2(g_t)/2$. Furthermore, if the probability of occurrence $p(g_t)$ of each possible value of $g_t$ is known, one can work out the average size of overflow for any combination of q and n may be expressed as:

$$\text{Average Unused Bits} = \sum_{i=0}^{n} p(g_i) \log_2(g_i)/2$$

The average unused bits is not dependent on the buffer size. The average percentage of bits unused if coding is done into a buffer of length B may be expressed as:

Percent Unused=100*(Average Unused Bits)/B

As may be seen, it is possible to work out the efficiency of a buffer of any length B provided the probabilities of the radix g are known.

It is worthwhile to note that the radix coder may be operating with radix g which is not generally a power of 2, and so the data in general may not simply be inserted into previous data as additional bits. If that were the case the buffer could be completely filled by the coder including a final incomplete symbol where necessary. Any buffer sent could always be complete as is well known and widely used in data communication. With radix coding, although sometimes the radix g can be a power of 2, in general, as is the purpose of the radix coder, symbols whose range is not a power of 2 may be mixed with those whose range is a power of 2.

From the above theory, the calculation of the efficiency of the coder using a first VLC coder for r and a second ideal code for pattern selection is shown in the table below for an example range of values of q between 0.05 and 0.5. For every q value there is a best value of n as shown. The numbers are the percentage by which the predicted number of bits exceeds the theoretical minimum. It may be seen that as q gets smaller, the coding with the best value of n gets closer and closer to the ideal, but this occurs at larger and larger values of n, meaning that very large numbers of patterns may be required if r is not very small. Also shown is the average number of bits unused in a buffer of any length at the optimum value of n.

| $q =$ | 0.05 | 0.10 | 0.15 | 0.20 | 0.25 | 0.30 | 0.35 | 0.40 | 0.45 | 0.50 |
|---|---|---|---|---|---|---|---|---|---|---|
| Entropy | 0.29 | 0.47 | 0.61 | 0.72 | 0.81 | 0.88 | 0.93 | 0.97 | 0.99 | 1.00 |
| Best % = | 1.5 | 1.8 | 2.1 | 2.3 | 2.6 | 2.6 | 2.8 | 2.8 | 2.6 | 3.3 |
| at $n =$ | 31 | 15 | 10 | 7 | 6 | 6 | 5 | 6 | 5 | 6 |
| *Avg* Buffer Cut | | | | | | | | | | |
| Bits | 3.3 | 2.4 | 2.0 | 1.5 | 1.4 | 1.6 | 1.3 | 1.8 | 1.4 | 1.8 |

Using the above information, or a similar calculation based on the above theory, one may choose a buffer size B to achieve for any probability q any desired overall percentage above the ideal, which must however be greater than the best percentage at a particular value of n. For example if q=0.05, we can see that we can get within 1.5% of the theoretical code length by choosing n=31. However on average 3.3 bits are lost every time we store or communicate the buffer. If we want the overall efficiency of the buffered coder to be within 2.5% of the theoretical limit, then we can allow the average 3.3 unfilled bits in the buffer to be 1% of the buffer size. Therefore with n=31, the buffer should be 330 bits or greater.

In this manner it may be seen that the buffer length may be chosen to reduce the unused bits in the buffer to as small a percentage of the total as may be desired. It will be clear to an expert in the field that as the probability q of a binary symbol may alter during a coding task, so the calculation of the best n and effect of buffer length can be carried out adaptively. Provided a coder and decoder are following the same rules in estimating and responding to changes in the statistics of the data, the buffer size may be changed adaptively along with other parameters of the coding process, for example.

The calculations described above may be performed for methods of coding the first code r other than the simple VLC. A Huffman code which is a particular form of VLC may perform similarly in some cases or slightly better. Similarly a Golomb code or an arithmetic code may be considered. With an arithmetic code the results might be predicted theoretically or by simulation. Many methods may be used to form the first and second binary symbol codes and when used with the Radix coder the embodiments disclosed herein are not limited to any particular method of forming the first binary symbol code or the second binary symbol code.

From the above example it may be seen that the best or preferred or otherwise determined value of n may be calculated and more generally several coding methods might also be evaluated and the results noted. From these results for a particular value of q a value of n and/or methods of coding either or both of the first code for r and the second code for s might be selected for a data sequence. Following one or more embodiments disclosed herein, the buffer size may also be adjusted to achieve compression which is as close to the theoretical minimum as may be desired, or best or acceptable or otherwise chosen compression.

Figure 6:
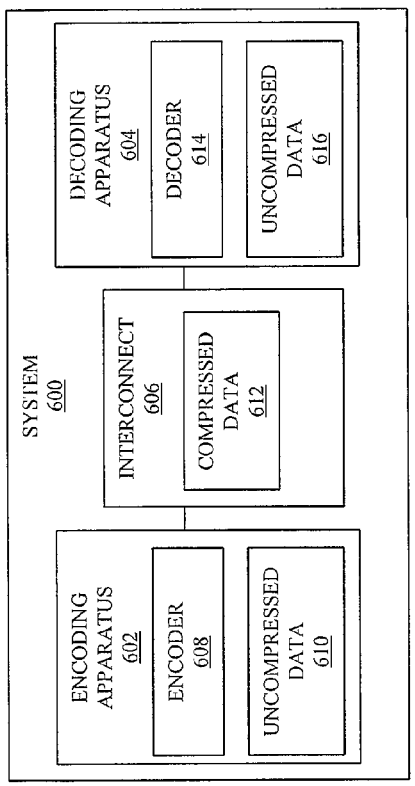
FIG. 6 is a block diagram illustrating an example system that may be employed in at least one embodiment.

FIG. 6 is a block diagram illustrating an example embodiment of a system 600 comprising an encoding apparatus 602 and a decoding apparatus 604 in accordance with one or more embodiments. In one embodiment, system 600 may include encoding apparatus 602, decoding apparatus 604 and a network 606. Alternatively or additionally, communication may not be over an interconnect 606. An interconnect may comprise, for example, one or more portions of a network, an interconnect between two or more devices in a computing platform, an interconnect between functional units of a device and/or an interconnect between two dies sharing a single package, as just a few examples. For example, system 600 may have encoding apparatus 602 and decoding apparatus 604 located within a single device and performing communications within the device.

In one embodiment, encoding apparatus 602 may include an encoder 608 which may be capable of performing one or more techniques as described above and/or as illustrated in FIGS. 1-5. As part of the technique, encoder 608 may take uncompressed data 610 and encode it, or a portion of it, into compressed data 612. In one embodiment, encoding apparatus 602 may transmit compressed data 612 to decoding apparatus 604, such as within a single device, over an interconnect within a computing platform, over an interconnect such as a network, and/or the like.

In one embodiment, decoding apparatus 604 may include a decoder 614, which may be capable of performing one or more techniques as described above and/or as illustrated in FIGS. 1-5. For example, decoder 614 may be capable of performing decoding technique as described above and illustrated in FIG. 4. As part of the technique decoder 614 may take compressed data 612 and decode it, or a portion of it, into uncompressed data 616. System 600 described above is not limited to any particular hardware or software configuration and all or part of system 600 may find applicability in any computing or processing environment such as is described below in FIG. 7. for example Referring to FIG. 7, a block diagram of an example computing platform 700 according to one or more embodiments is illustrated, although the scope of claimed subject matter is not limited in this respect. Computing platform 700 may include more and/or fewer components than those shown in FIG. 7. However, generally conventional components may not be shown, for example, a battery, a bus, and so on.

Figure 7:
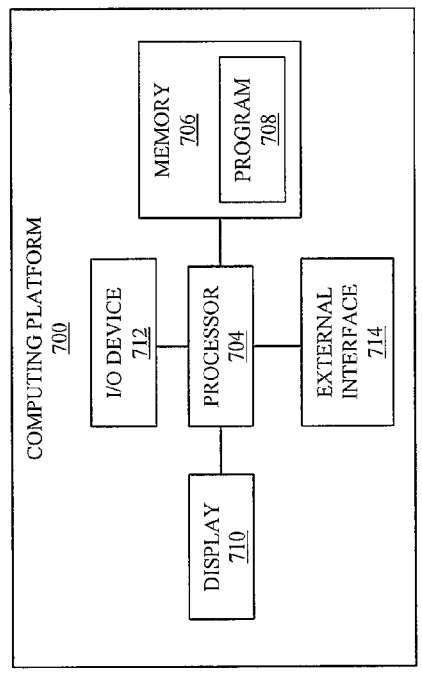
FIG. 7 is a block diagram illustrating an example computing platform that may be employed in at least one embodiment.

Computing platform 700, as shown in FIG. 7 may be utilized to embody a computer program and/or graphical user interface by providing hardware components on which the computer program and/or graphical user interface may be executed. Computing platform 700 may be utilized to embody tangibly all or a portion of embodiments described herein. Such a procedure, computer program and/or machine readable instructions may be stored tangibly on a computer and/or machine readable storage medium such as a compact disk (CD), digital versatile disk (DVD), flash memory device, hard disk drive (HDD), and so on. As shown in FIG. 7, computing platform 700 may be controlled by processor 704, including one or more auxiliary processors (not shown). Processor 704 may comprise a central processing unit such as a microprocessor or microcontroller for executing programs, performing data manipulations, and controlling the tasks of computing platform 700. Auxiliary processors may manage input/output, perform floating point mathematical operations, manage digital signals, perform fast execution of signal processing algorithms, operate as a back-end processor and/or a slave-type processor subordinate to processor 704, operate as an additional microprocessor and/or controller for dual and/or multiple processor systems, and/or operate as a coprocessor and/or additional processor. Such auxiliary processors may be discrete processors and/or may be arranged in the same package as processor 704, for example, in a multicore and/or multithreaded processor; however, the scope of the scope of claimed subject matter is not limited in these respects.

Communication with processor 704 may be implemented via a bus (not shown) for transferring information among the components of computing platform 700. A bus may include a data channel for facilitating information transfer between storage and other peripheral components of computing platform 700. A bus further may provide a set of signals utilized for communication with processor 704, including, for example, a data bus, an address bus, and/or a control bus. A bus may comprise any bus architecture according to promulgated standards, for example, industry standard architecture (ISA), extended industry standard architecture (EISA), micro channel architecture (MCA), Video Electronics Standards Association local bus (VLB), peripheral component interconnect (PCI) local bus, PCI express (PCIe), hyper transport (HT), standards promulgated by the Institute of Electrical and Electronics Engineers (IEEE) including IEEE 488 general-purpose interface bus (GPIB), IEEE 696/S-100, and so on, although the scope of the scope of claimed subject matter is not limited in this respect.

Other components of computing platform 700 may include, for example, memory 706, including one or more auxiliary memories (not shown). Memory 706 may provide storage of instructions and data for one or more programs 708 to be executed by processor 704, such as all or a portion of embodiments described herein, for example. Memory 706 may be, for example, semiconductor-based memory such as dynamic random access memory (DRAM) and/or static random access memory (SRAM), and/or the like. Other semiconductor-based memory types may include, for example, synchronous dynamic random access memory (SDRAM), Rambus dynamic random access memory (RDRAM), ferroelectric random access memory (FRAM), and so on. Alternatively or additionally, memory 706 may be, for example, magnetic-based memory, such as a magnetic disc memory, a magnetic tape memory, and/or the like; an optical-based memory, such as a compact disc read write memory, and/or the like; a magneto-optical-based memory, such as a memory formed of ferromagnetic material read by a laser, and/or the like; a phase-change-based memory such as phase change memory (PRAM), and/or the like; a holographic-based memory such as rewritable holographic storage utilizing the photorefractive effect in crystals, and/or the like; and/or a molecular-based memory such as polymer-based memories, and/or the like. Auxiliary memories may be utilized to store instructions and/or data that are to be loaded into memory 706 before execution. Auxiliary memories may include semiconductor based memory such as read-only memory (ROM), programmable read-only memory (PROM), erasable programmable read-only memory (EPROM), electrically erasable read-only memory (EEPROM), and/or flash memory, and/or any block oriented memory similar to EEPROM. Auxiliary memories also may include any type of non-semiconductor-based memories, including, but not limited to, magnetic tape, drum, floppy disk, hard disk, optical, laser disk, compact disc read-only memory (CD-ROM), write once compact disc (CD-R), rewritable compact disc (CD-RW), digital versatile disc read-only memory (DVD-ROM), write once DVD (DVD-R), rewritable digital versatile disc (DVD-RAM), and so on. Other varieties of memory devices are contemplated as well.

Computing platform 700 further may include a display 710. Display 710 may comprise a video display adapter having components, including, for example, video memory, a buffer, and/or a graphics engine. Such video memory may be, for example, video random access memory (VRAM), synchronous graphics random access memory (SGRAM), windows random access memory (WRAM), and/or the like. Display 710 may comprise a cathode ray-tube (CRT) type display such as a monitor and/or television, and/or may comprise an alternative type of display technology such as a projection type CRT type display, a liquid-crystal display (LCD) projector type display, an LCD type display, a light-emitting diode (LED) type display, a gas and/or plasma type display, an electroluminescent type display, a vacuum fluorescent type display, a cathodoluminescent and/or field emission type display, a plasma addressed liquid crystal (PALC) type display, a high gain emissive display (HGED) type display, and so forth.

Computing platform 700 further may include one or more I/O devices 712. I/O device 712 may comprise one or more I/O devices 712 such as a keyboard, mouse, trackball, touchpad, joystick, track stick, infrared transducers, printer, modem, RF modem, bar code reader, charge-coupled device (CCD) reader, scanner, compact disc (CD), compact disc read-only memory (CD-ROM), digital versatile disc (DVD), video capture device, TV tuner card, touch screen, stylus, electroacoustic transducer, microphone, speaker, audio amplifier, and/or the like.

Computing platform 700 further may include an external interface 714. External interface 714 may comprise one or more controllers and/or adapters to prove interface functions between multiple I/O devices 712. For example, external interface 714 may comprise a serial port, parallel port, universal serial bus (USB) port, and IEEE 1394 serial bus port, infrared port, network adapter, printer adapter, radio-frequency (RF) communications adapter, universal asynchronous receiver-transmitter (UART) port, and/or the like, to interface between corresponding I/O devices 712. External interface 714 for an embodiment may comprise a network controller capable of providing an interface, directly or indirectly, to a network, such as, for example, the Internet.

It is noted, of course, that claimed subject matter is not limited to particular embodiments. Therefore, in addition to covering methods for coding and/or decoding of data, claimed subject matter is also intended to cover, for example, software incorporating such methods and to coders and/or decoders (whether implemented in hardware or software, or a combination of hardware and software). Claimed subject matter is also intended to include a video or audio codec embodying such methods and/or a video or audio compression system whereby data may be encoded according to a method as described or claimed. For example, embodiments may include transmitting data across a communications channel for reconstruction be a decoder at the far end. Likewise, alternatively, in another embodiment in accordance with claimed subject matter coded data may be stored rather than transmitted. Thus, claimed subject matter is intended to cover these as well as other embodiments.

Embodiments in accordance with claimed subject matter may be applied to coding of data of all types, including non-numeric data, such as symbolic data, for example. Embodiments may be employed to perform radix coding, although it will, of course, be understood that claimed subject matter is not limited to that application. It is intended that embodiments of claimed subject matter be applied to any one of a number of different types of data coding. Therefore, claimed subject matter is not intended to be limited in terms of the type of data to which it may be applied.

In the preceding description, various aspects of claimed subject matter have been described. For purposes of explanation, systems and configurations were set forth to provide a thorough understanding of claimed subject matter. However, it should be apparent to one skilled in the art having the benefit of this disclosure that claimed subject matter may be practiced without the specific details. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that appended claims are intended to cover all such modifications and/or changes as fall within the true spirit of claimed subject matter.

The invention claimed is:

1. A method of buffering data symbols comprising:
   determining a maximum value resulting from coding a data symbol of a sequence of data symbols into a buffer based at least in part on a radix of the data symbol;
   comparing said maximum value with a buffer capacity of the buffer;
   scaling the data symbol based at least in part on the radix if the maximum value does not exceed the buffer capacity; and
   coding the scaled data symbol into the buffer if the maximum value does not exceed the buffer capacity.

2. The method of claim 1, further comprising:
   repeating said determining, said comparing, said scaling, and said coding for additional data symbols from the sequence of data symbols.

3. The method of claim 1, wherein the sequence of data symbols comprises fixed radix data symbols.

4. The method of claim 1, wherein the sequence of data symbols comprises mixed radix data symbols.

5. The method of claim 1, further comprising altering the buffer capacity in response to the comparing.

6. The method of claim 5, wherein said altering comprises increasing the buffer capacity.

7. The method of claim 1, further comprising providing the buffer to a decoder to decode contents of the buffer if the maximum value resulting from coding a second data symbol from the sequence of data symbols exceeds the buffer capacity.

8. The method of claim 7, wherein a length of the buffer is known by the decoder prior to decoding the contents of the buffer.

9. The method of claim 7, wherein decoding the buffer comprises decoding data symbols in an order in which they were coded.

10. The method of claim 1, wherein a first part of a code and a second part of the code result from combinatorial coding, wherein the sequence of data symbols comprises the second part of the code.

11. A computer-readable medium having computer-readable instructions stored thereon that, if executed by a processor, cause a computing device to:
    determine a maximum value resulting from coding a data symbol of a sequence of data symbols into a buffer based at least in part on a radix of the data symbol;
    compare said maximum value with a buffer capacity of the buffer;
    scale the data symbol based at least in part on the radix if the maximum value does not exceed the buffer capacity; and
    code the scaled data symbol into the buffer if the maximum value does not exceed the buffer capacity.

12. The computer-readable medium of claim 11, wherein the computer-readable instructions, if executed, further cause the computing device to:
    repeat said determining, said comparing, said scaling, and said coding until each data symbol of the sequence of data symbols is coded.

13. The computer-readable medium of claim 11, wherein the sequence of data symbols comprises fixed radix data symbols.

14. The computer-readable medium of claim 11, wherein the sequence of data symbols comprises mixed radix data symbols.

15. The computer-readable medium of claim 11, wherein the computer-readable instructions, if executed, further cause the computing device to:
    alter the buffer capacity in response to the comparing.

16. The computer-readable medium of claim 15, wherein altering the buffer capacity comprises increasing the buffer capacity to accommodate the maximum value.

17. The computer-readable medium of claim 11, wherein the computer-readable instructions, if executed, further cause the computing device to:
    provide the buffer to a decoder to decode contents of the buffer if the buffer is full.

18. The computer-readable medium of claim 17, wherein a length of the buffer is known by the decoder prior to decoding the contents of the buffer.

19. The computer-readable medium of claim 17, wherein data symbols are decoded in an order in which they were coded.

20. The computer-readable medium of claim 11, wherein a first part of a code and a second part of the code result from combinatorial coding, wherein the sequence of data symbols comprises the second part of the code.

21. A buffered radix coder, comprising:

a processor configured to determine a maximum value resulting from coding a data symbol from a sequence of data symbols into a buffer based at least in part on a radix of the data symbol;

compare said maximum value with a buffer capacity;

scale the data symbol based at least in part on the radix if the maximum value does not exceed the buffer capacity; and code the scaled data symbol into the buffer if the maximum value does not exceed the buffer capacity.

22. The buffered radix coder of claim 21, wherein the processor is further configured to:

repeat the determining, the comparing, the scaling, and the coding by employing one or more additional buffers until each data symbol of the sequence of data symbols is buffered.

23. The buffered radix coder of claim 21, wherein the sequence of data symbols comprises fixed radix data symbols.

24. The buffered radix coder of claim 23, wherein the sequence of data symbols comprises mixed radix data symbols.

25. The buffered radix coder of claim 21, wherein the processor is further configured to:

alter the buffer capacity in response to the comparing.

26. The buffered radix coder of claim 25, wherein the altering comprises increasing the buffer capacity to accommodate at least the maximum value.

27. The buffered radix coder of claim 21, further comprising:

a decoding apparatus configured to decode contents of the buffer, wherein the decoding apparatus is further configured to receive the buffer when the buffer is full.

28. The buffered radix coder of claim 27, wherein a length of the buffer is known by the decoding apparatus prior to decoding the contents of the buffer.

* * * * *